US009985414B1

(12) United States Patent
Wise

(10) Patent No.: US 9,985,414 B1
(45) Date of Patent: May 29, 2018

(54) OPEN-LOOP LASER POWER-REGULATION

(71) Applicant: Banner Engineering Corp., Plymouth, MN (US)

(72) Inventor: Ashley Wise, Plymouth, MN (US)

(73) Assignee: Banner Engineering Corp., Plymouth, MN (US)

( * ) Notice: Subject to any disclaimer, the term of this patent is extended or adjusted under 35 U.S.C. 154(b) by 0 days. days.

(21) Appl. No.: 15/625,949

(22) Filed: Jun. 16, 2017

(51) Int. Cl.
| H01S 3/13 | (2006.01) |
| H01S 5/06 | (2006.01) |
| H01S 5/068 | (2006.01) |
| H01S 5/0683 | (2006.01) |

(52) U.S. Cl.
CPC ........ H01S 5/0617 (2013.01); H01S 5/06804 (2013.01); H01S 5/06808 (2013.01); H01S 5/06812 (2013.01); H01S 5/06832 (2013.01)

(58) Field of Classification Search
CPC ............. H01S 5/06804; H01S 5/06808; H01S 5/06812; H01S 5/06832; H01S 5/0617
See application file for complete search history.

(56) References Cited

U.S. PATENT DOCUMENTS

| 4,577,320 A | 3/1986 | Yoshikawa et al. |
| 4,611,270 A | 9/1986 | Klauminzer et al. |
| 4,677,632 A | 6/1987 | Lisco et al. |
| 4,698,817 A | 10/1987 | Burley |
| 4,796,266 A | 1/1989 | Banwell et al. |
| 4,815,080 A | 3/1989 | Chesnoy et al. |
| 4,879,459 A | 11/1989 | Negishi |
| 4,903,273 A | 2/1990 | Bathe |
| 4,952,949 A | 8/1990 | Uebbing |
| 4,982,203 A | 1/1991 | Uebbing et al. |
| 4,995,045 A | 2/1991 | Burley et al. |
| 5,018,154 A | 5/1991 | Ohashi |
| 5,019,769 A | 5/1991 | Levinson |

(Continued)

FOREIGN PATENT DOCUMENTS

| CN | 1577539 A | 2/2005 |
| CN | 1655413 A | 8/2005 |

(Continued)

*Primary Examiner* — Kinam Park
(74) *Attorney, Agent, or Firm* — Craige Thompson; Thompson Patent Law

(57) ABSTRACT

Apparatus and associated methods relate to an open-loop control circuit (OLCC) configured to determine a lasing element drive current as a function of a commanded optical power signal and a measured temperature signal, where the absolute value of the second derivative of the optical output power with respect to laser drive current exceeds a predetermined threshold. In an illustrative example, the absolute value of the second derivative may exceed the predetermined threshold in a non-linear operating region of the laser element. The non-linear operating region may represent, for example, a characteristic output power vs. drive current curve of the lasing element. The OLCC may provide laser peak power control for arbitrary peak power, within linear and non-linear regions of laser efficiency. In some embodiments, the OLCC may substantially improve control over laser optical output power over a wide dynamic range of, for example, temperature associated with the lasing element.

20 Claims, 6 Drawing Sheets

(56) References Cited

U.S. PATENT DOCUMENTS

| | | | |
|---|---|---|---|
| 5,146,464 A * | 9/1992 | Uemura | H01S 5/06832 372/26 |
| 5,157,676 A | 10/1992 | Wilcox | |
| 5,216,682 A | 6/1993 | Hedberg | |
| 5,311,005 A | 5/1994 | Visocchi | |
| 5,383,208 A | 1/1995 | Queniat et al. | |
| 5,579,328 A | 11/1996 | Habel et al. | |
| 5,604,757 A | 2/1997 | Liang et al. | |
| 5,675,600 A | 10/1997 | Yamamoto et al. | |
| 5,734,672 A | 3/1998 | McMinn et al. | |
| 5,752,100 A | 5/1998 | Schrock | |
| 5,761,230 A | 6/1998 | Oono et al. | |
| 5,844,928 A | 12/1998 | Shastri et al. | |
| 5,850,409 A | 12/1998 | Link | |
| 6,108,114 A | 8/2000 | Gilliland et al. | |
| 6,160,647 A | 12/2000 | Gilliland et al. | |
| 6,195,370 B1 | 2/2001 | Haneda et al. | |
| 6,414,974 B1 | 7/2002 | Russell et al. | |
| 6,466,595 B2 | 10/2002 | Asano | |
| 6,661,820 B1 | 12/2003 | Camilleri et al. | |
| 6,671,248 B2 | 12/2003 | Miyabata et al. | |
| 6,711,189 B1 | 3/2004 | Gilliland et al. | |
| 6,917,639 B2 | 7/2005 | Ishida et al. | |
| 6,947,456 B2 | 9/2005 | Chin et al. | |
| 6,975,658 B1 | 12/2005 | Roach | |
| 7,209,502 B2 | 4/2007 | Brosnan | |
| 7,447,247 B1 * | 11/2008 | Doscher | H01S 5/06808 372/38.02 |
| 7,473,880 B2 | 1/2009 | Brosnan | |
| 7,620,329 B2 | 11/2009 | Reintjes et al. | |
| 7,738,796 B2 | 6/2010 | Sanchez | |
| 8,279,416 B2 | 10/2012 | Reiner et al. | |
| 2002/0064193 A1 | 5/2002 | Diaz et al. | |
| 2004/0052299 A1 | 3/2004 | Jay et al. | |
| 2004/0135992 A1 | 7/2004 | Munro | |
| 2005/0025018 A1 * | 2/2005 | Hsu | G11B 7/1263 369/53.26 |
| 2005/0078722 A1 | 4/2005 | Wu et al. | |
| 2005/0180473 A1 * | 8/2005 | Brosnan | H01S 5/042 372/38.02 |
| 2007/0195477 A1 | 8/2007 | Brosnan | |
| 2009/0016387 A1 * | 1/2009 | Durkin | G02B 6/024 372/25 |
| 2009/0141761 A1 * | 6/2009 | Egawa | H04N 9/3129 372/38.02 |
| 2011/0260623 A1 * | 10/2011 | Morita | H01S 5/0617 315/117 |
| 2014/0197140 A1 * | 7/2014 | Unrath | B23K 26/03 219/121.62 |

FOREIGN PATENT DOCUMENTS

| | | |
|---|---|---|
| CN | 1300788 C | 2/2007 |
| CN | 104604051 A | 5/2015 |
| CN | 104903044 A | 9/2015 |
| EP | 0421674 A2 | 4/1991 |
| EP | 2363927 A2 | 9/2011 |
| WO | WO-2007/132182 A2 | 11/2007 |
| WO | WO-2016/184246 A1 | 11/2016 |

* cited by examiner

OPEN-LOOP LASER POWER-REGULATION

TECHNICAL FIELD

Various embodiments relate generally to applications using laser diodes and laser diode drivers.

BACKGROUND

Lasers sources, such as diodes and vertical-cavity surface-emitting lasers (VCSELs), are employed in a range of applications. Applications may include, but are not limited to, presence and positioning in photoelectric sensors, distance measurement in triangulation and time of flight sensors, optical media reading and writing, and camera lens position and auto-focus mechanisms.

Laser products may be designed for compliance with laser safety standards, such as FDA Class I and Class II. These standards prescribe regulatory limits on the peak and average optical power based on parameters such as wavelength, pulse width, and duty cycle.

Class I laser devices are considered inherently safe in that there is no significant risk of eye damage. Class I designs may either emit a low power output or include an enclosure preventing user access. Class I devices may be employed in such applications as CD players and laser printers.

Class II laser devices include those for which the nominal blink reflex of a human may prevent eye damage. Further, output power may be up to 1 mW. This class includes industrial sensors and barcode scanners, for example.

SUMMARY

Apparatus and associated methods relate to an open-loop control circuit (OLCC) configured to determine a lasing element drive current as a function of a commanded optical power signal and a measured temperature signal, where the absolute value of the second derivative of the optical output power with respect to laser drive current exceeds a predetermined threshold. In an illustrative example, the absolute value of the second derivative may exceed the predetermined threshold in a non-linear operating region of the laser element. The non-linear operating region may represent, for example, a characteristic output power vs. drive current curve of the lasing element. The OLCC may provide laser peak power control for arbitrary peak power, within linear and non-linear regions of laser efficiency. In some embodiments, the OLCC may substantially improve control over laser optical output power over a wide dynamic range of, for example, temperature associated with the lasing element.

In some embodiments, the OLCC may include a per-laser calibration containing both the linear and non-linear portions of the laser efficiency curve. The calibration may be pre-programmed as a look-up-table. In some examples, calibration may be pre-programmed as equation coefficients.

Various embodiments may achieve one or more advantages. For example, some embodiments may provide laser peak power control for arbitrary peak power levels, including power levels outside of the linear laser efficiency region (e.g., those levels near the lasing turn-on threshold, and those near the upper optical power limit). More precise, open-loop control may advantageously increase the usable dynamic range of the laser and system while satisfying applicable optical safety standards.

In some embodiments, the OLCC may also drive laser diodes with high power (e.g., outside their linear power efficiency range) and within a wide range of ambient temperatures, which may advantageously facilitate installation of the OLCC in system applications that are designed, for example, to detect dark targets over wide temperature ranges and/or long sensing distances. Further, some embodiments of the described methods may yield a resulting drive current that may enable the OLCC to generate any desired peak optical power level within the safe operation region of a laser element. In various examples, the turn-on and turn-off times of the laser, as well as the optical pulse shape, may remain substantially consistent as the laser output optical power changes over temperature.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary use case is briefly introduced with reference to FIG. 1. Second, with reference to FIG. 2, a hardware block diagram further defines an exemplary open-loop control circuit (OLCC). Next with reference to FIGS. 3 and 4, the discussion turns to exemplary embodiments that illustrate details of OLCC calculations, specifically, methods of calculating laser diode input current for desired output optical power. Finally, with reference to FIGS. 5 and 6, exemplary software flow diagrams outline the general functional methodologies of exemplary OLCCs.

Figure 1:
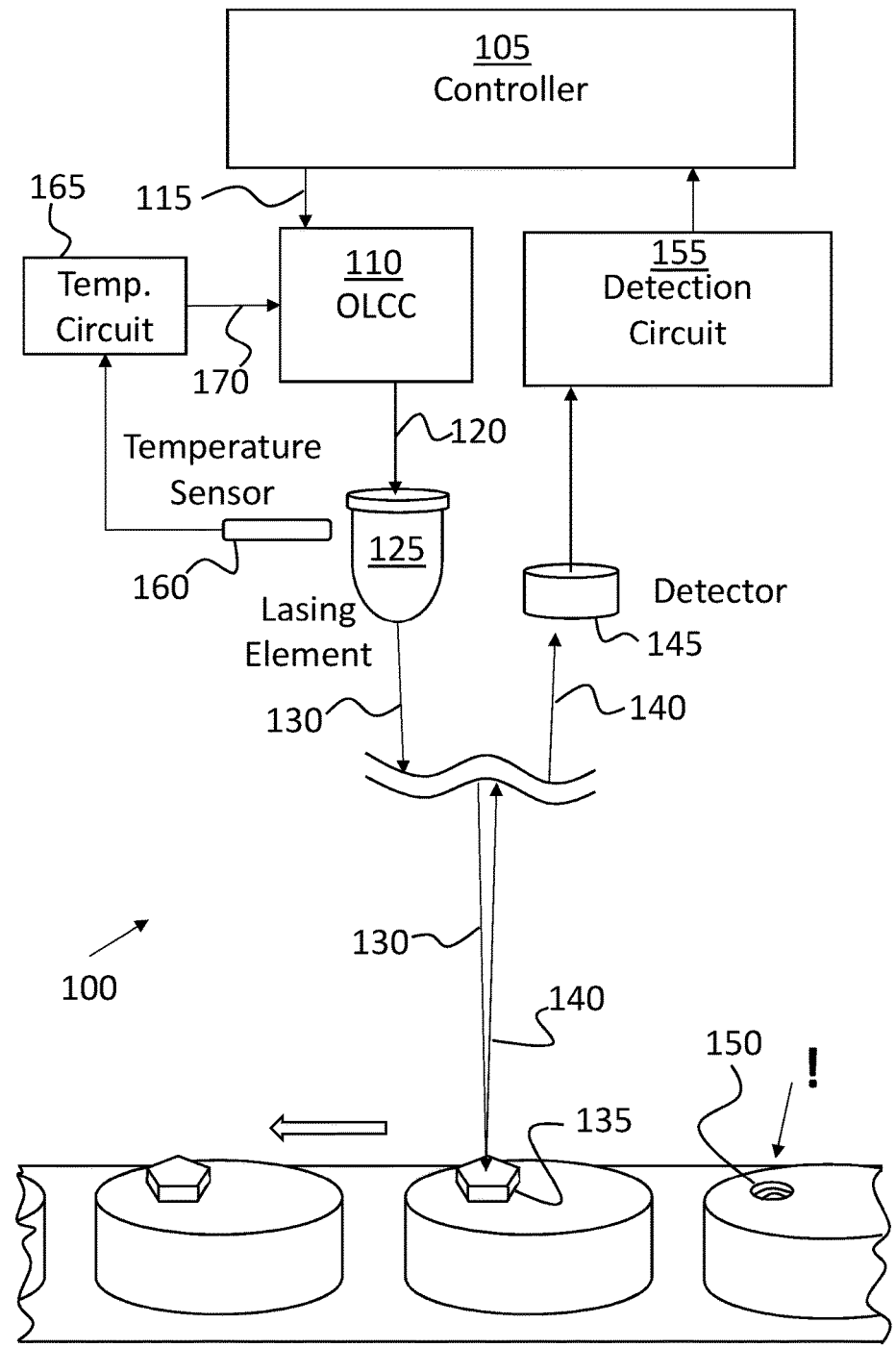
FIG. 1 depicts a mixed block diagram and perspective view of an exemplary open-loop control circuit (OLCC) factory use case.

FIG. 1 depicts a mixed block diagram and perspective view of an exemplary open-loop control circuit (OLCC) factory use case. An exemplary OLCC factory use case 100 includes a controller 105. The controller 105 is electrically coupled to an OLCC 110. In operation, the OLCC 110 receives an optical power level 115 from the controller 105. Further, the OLCC 110 calculates a drive current 120 from the received optical power level 115. The OLCC 110 is electrically coupled to a lasing element 125. The lasing element 125 receives the drive current 120, and produces an optical output power beam 130. Due to the drive current 120, calculated by the OLCC 110 in response to the commanded optical power level 115, the lasing element 125 outputs the commanded optical power in the form of the beam 130. The beam 130 is targeted on the head of a bolt 135.

A reflected beam 140 makes its way to a detector 145. In some examples, the transit time of the beams 130 and 140 may be used to determine distance. In some examples, the percent remission of the beams 130 and 140 may be used to determine intensity/distance. In further examples, the return angle of the reflected beam 140 may be used to determine distance. Accordingly, any one or combination of these methods may be employed to determine distance.

In the depicted use case 100, if the beam 130 had landed upon a missing head of a bolt or a void 150, the location distance determined from the reflected beam 140 may have been indicative of the anomaly.

The detector 145 is electrically coupled to a detection circuit 155. The detection circuit 155 may include analog and/or digital components (e.g., analog conditioning, FPGA, ASIC). The detection circuit 155 may be operable to convert analog signals to digital signals which may be sent to the controller 105. Accordingly, the detection circuit 155 converts the output of the detector 145 into a digital form readable by the controller 105. In some embodiments, the detection circuit 155 may be an analog conditioning circuit, sending a conditioned analog signal from the detector 145 to the controller 105. Further, in such embodiments, the controller 105 may be operable to receive an analog signal.

The ambient temperature surrounding the lasing element 125 is sensed by a temperature sensor 160. The temperature sensor 160 is electrically coupled to a temperature circuit 165. The temperature circuit 165 converts the signal from the temperature sensor 160 into a temperature signal 170 readable by the OLCC 110. The OLCC 110 may advantageously provide laser peak power control for arbitrary input peak optical power levels 115 and temperature signals 170 within linear and non-linear regions of laser efficiency, increasing usable dynamic range.

Figure 2:
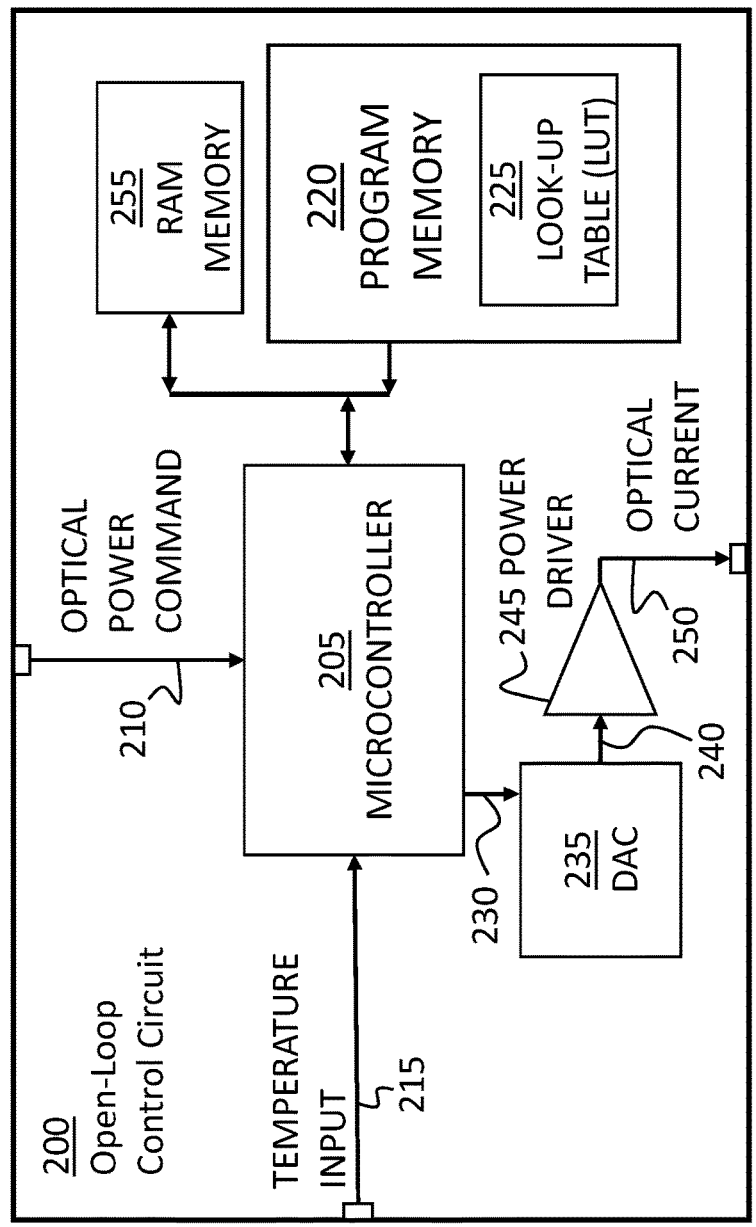
FIG. 2 depicts a block diagram of an exemplary OLCC.

FIG. 2 depicts a block diagram of an exemplary OLCC. An OLCC 200 includes a microcontroller 205. The microcontroller 205 receives an optical power command 210 and a temperature input 215. The microcontroller 205 accesses a look-up-table (LUT) 225 within a program memory 220 to retrieve predetermined parameters representative of a characteristic of optical output power vs. drive current at each of a number of temperatures. In various examples, the LUT may be pre-programmed in internal and/or external non-volatile memory (e.g., electrically erasable programmable read-only memory (EEPROM)). Further, the LUT may be loaded into volatile memory (random access memory (RAM)) to facilitate run-time execution. In some embodiments, the LUT may be pre-programmed in to flash memory. In some examples, the LUT may be copied into flash memory during run-time execution.

A number of implementations have been described regarding the location and use of the LUT. Nevertheless, it will be understood that various techniques and memory devices may be employed. For example, advantageous results may be achieved if the steps of the disclosed techniques were performed in a different sequence, or if components were combined in a different manner, or if the components were supplemented with other components. Accordingly, other implementations are contemplated.

By determining the optical drive current needed to generate the commanded optical power at the measured temperature indicated by the temperature input 215, the microcontroller 205 may determine an optical power drive value 230. The look up table, which is explained in more detail with reference to FIG. 2, is operable to provide a resulting lasing current data value in response to a value representing the particular desired laser output power, adjusted for the measured temperature.

The microprocessor 205 writes the determined optical power drive value 230 to an analog converter (DAC) 235. In some examples, the DAC 235, as well as other peripherals (e.g., memory, pulse width modulators (PWMs), timers, and analog-to-digital converters (ADCs)) may be grouped with the microprocessor, and embodied as a microcontroller. The DAC 235 converts the optical power drive value 230 to an analog signal 240. The analog signal 240 is fed to a power driver 245, which may, for example, have a low impedance output. The output of the power driver 245 is a laser drive current 250 operable to drive a lasing element. The OLCC 200 may advantageously control a laser drive current 250, resulting in laser peak power control for arbitrary input optical power commands 210 and ambient temperature inputs 215 within linear and nonlinear regions of laser efficiency based on predetermined parameter values stored in the look-up-table 225.

The microcontroller 205 couples to a RAM memory 255. The RAM memory 255 may facilitate basic executional functionality to the microcontroller 205. In some examples, the RAM memory 255 may be included within the microcontroller 205. In some examples, the program memory 220 with the look-up-table 225 may also be included in the microcontroller 205.

In some embodiments, as it relates to the block diagram of FIG. 1, the controller 105 may include a dedicated microcontroller. In various examples, the microcontroller within the controller 105 may be the very same microcontroller 205 in FIG. 2. Accordingly, the OLCC 110 may be exemplified by the OLCC 200, and as such may include the microcontroller 205. In some embodiments, the microcontrollers 105 and 205 and the supporting members may be supplemented by, or incorporated in hardware programmable devices, such as FPGAs, for example.

In some embodiments, the OLCC 110 and/or the OLCC 200 may be a software algorithm running on the microcontroller 105 and/or the microcontroller 205. Further, the microcontroller 105 and 205 may include embedded DAC, ADC, RAM, and Flash memory. In some embodiments, external EEPROM may be employed.

Figure 3:
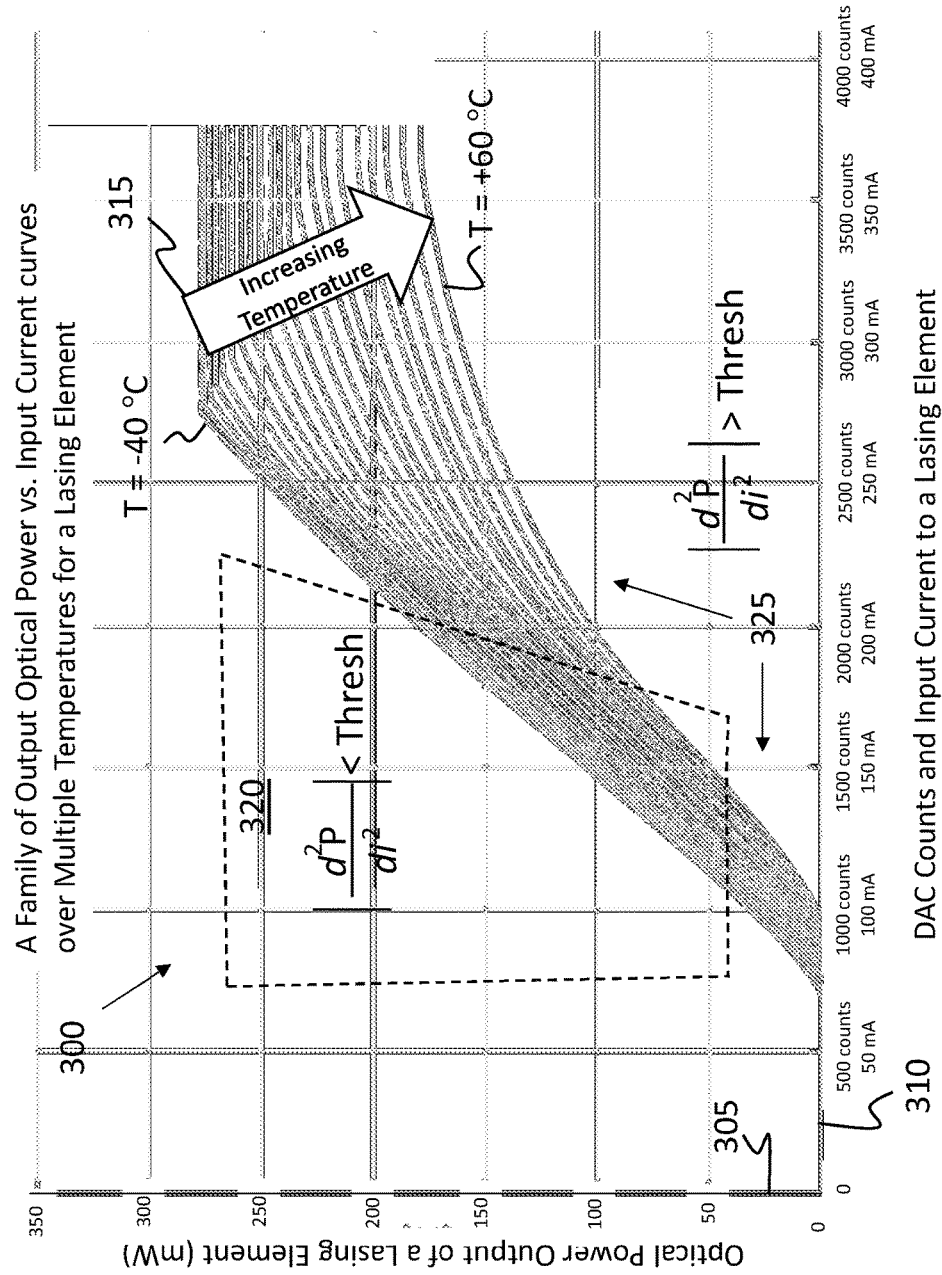
FIG. 3 depicts a graph of a family of temperature curves for an exemplary laser output optical power versus a laser input current.

FIG. 3 depicts a graph of a family of temperature curves for an exemplary laser output optical power versus a laser input current. A family of curves 300 includes a y-axis representing an output optical power 305 in milliwatts (mW). The family of curves 300 also includes an x-axis representing DAC counts which is proportional to a peak laser input current 310.

For a given laser input current 310, the resulting laser output optical power 305 changes non-linearly over a temperature 315. Therefore, for a given laser output optical power 305, the corresponding laser input current 310 changes non-linearly over temperature 315. The corresponding laser input current 310 vs temperature 315 is also dependent on the level of the output optical power 305. The OLCC may adjust the laser input current 310 to maintain the desired laser output optical power 305 for a range of temperatures 315. Further, since the non-linear laser input current 310 compensation over temperature 315 is different for every desired laser output optical power 305, the OLCC may employ a look-up-table (LUT) to generate the array of laser input currents 310 for the array of laser output optical powers 305.

Continuing with reference to FIG. 3, each curve represents a specific temperature 315 from −40° C. to +60° C. In various examples, the temperature range corresponding to the laser source may extend, for example, from about −40° C. to about +85° C., which may account for a temperature rise at the laser source relative to the ambient temperature. On the X-axis, a Digital-to-Analog Converter (DAC) is fed 0-4000 counts, representing 0-400 mA laser input current 310 in this example. In an illustrative example, in the depicted family of curves 300, for a laser input current 310 of 200 mA, the laser output optical power 305 may vary from about 100 mW to about 180 mW over a 120° C. range of temperatures 315.

In some embodiments, the OLCC may perform a per-laser calibration at one reference temperature. The OLCC calibration may learn the complete laser efficiency curve, and may not be limited to a first order slope. The calibration may be stored into memory as coefficients to a multi-order equation. In some examples, the calibration may be stored into memory as a look-up-table (LUT). A first order slope is depicted in FIG. 3, in an area 320. The area 320 represents a linear region with substantially unchanging slopes. Slopes in this area may be described as satisfying the equation:

$$\left|\frac{d^2P}{di^2}\right| < \text{Thresh} \qquad (\text{Eqn. 1})$$

Where:
P is the optical output power 305 of a lasing element.
i is the input current 310 to a lasing element.
Thresh is a pre-determined threshold representing a curvature limit.

A higher order slope is depicted in FIG. 3, in an area 325. The area 325 represents a non-linear region with changing slopes. Slopes in this area may be described as satisfying the equation:

$$\left|\frac{d^2P}{di^2}\right| > \text{Thresh} \qquad (\text{Eqn. 2})$$

In some implementations, a substantially non-linear portion of a laser efficiency curve or efficiency characteristic may be defined by the percent error of optical power output of the characteristic curve from a linear approximation, where the percent error may be, for example, about 0.1%, 0.2%, 0.3%, 0.4%, 0.5%, 0.6%, 0.7%, 0.8%, 0.9%, 1.0%, 1.5%, 2%, 2.5%, 3%, 4%, 5%, 6%, 7%, 8%, 9%, 10%, 15% or about 20%, over a wide dynamic temperature range such as from −40° C. to about 85° C., at the laser source, such as ambient to the laser component package.

In some embodiments, at a nominal room temperature, the percent error may be, for example, about 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5% or about 5%. In various examples, the percent error may include as one component, a non-linearity that produces a variance from the linear approximation.

Figure 4:
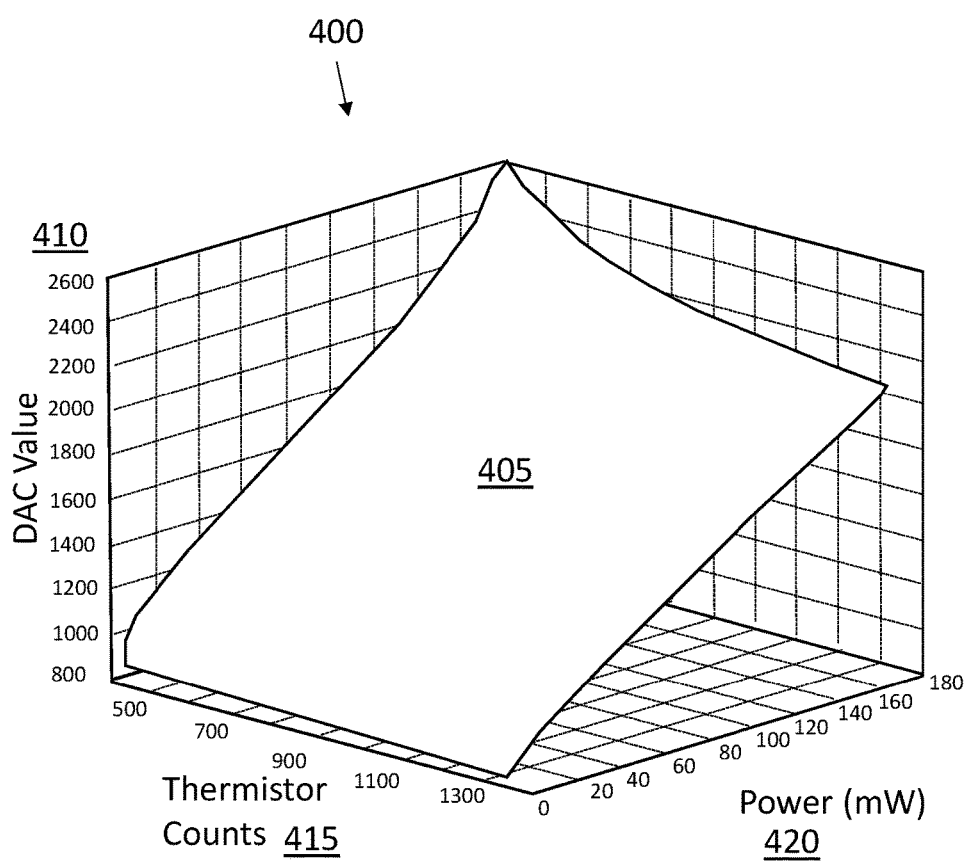
FIG. 4 depicts a 3-dimensional graph of the resulting DAC setting as a function of temperature and desired laser output optical power used in an exemplary OLCC.

FIG. 4 depicts a 3-dimensional graph of the resulting DAC setting as a function of temperature and desired laser output optical power used in an exemplary OLCC. A 3-dimensional graph 400 includes a surface 405. The surface 405 represents the laser input current 410 (shown as a DAC value) as a function of both temperature 415 (shown as thermistor counts) and desired optical output power 420. In some embodiments, the 3-dimensional curve may be in the form of a multi-order equation. In some embodiments, the 3-dimensional surface 405 may be in the form of an LUT pre-programmed in a memory device.

In some examples, a combination of LUTs and equations may be employed to determine the laser input current 410 at any temperature 415 that results in the desired output optical power 420. If an LUT is employed, values between LUT points may be interpolated using various methods, including but not limited to linear or spline interpolation. The interpolation may effectively increase the control resolution, allowing for substantially continuous control of laser output optical power 420, not limited to the resolution of the LUT points.

In some embodiments, a multi-order polynomial equation may be employed within the OLCC to calculate the laser input current 410 for a given laser peak optical power 420. In some examples, the polynomial may not be limited to a $1^{st}$, $2^{nd}$ or $3^{rd}$ order expression. The polynomial equation may take the form of:

$$y(x,T) = A(T)x^2 + B(T)x + C(T) \qquad (\text{Eqn. 3})$$

Where:
x is the laser output optical power
y is the lasing input current to a lasing element
A, B and C are coefficients that are temperature dependent Further, in some embodiments, the pre-programmed code may employ an equation instead of an LUT to determine the input drive current for the lasing element. The software may employ the equation directly, advantageously occupying a smaller memory space. In some examples, an LUT containing the results of the equation may be employed, advantageously increasing software execution speed.

In some examples, a digitized temperature and a digitized power may be connected to the address lines of a Read-Only Memory (ROM) programmed with predetermined values, such that the surface 405 may result. The digital values may then be fed to a Digital to Analog Converter (DAC) which may control a current output drive. The current output then may drive the lasing element to a desired. Further, with this configuration the OLCC may be implemented without a microcontroller.

In some embodiments, the generated optical power output of the OLCC may substantially track the desired optical power output as an input to the OLCC. For example, the tracking accuracy may be within 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5% or within about 5%. In some examples, the tracking accuracy may be 10% or more.

Figure 5:
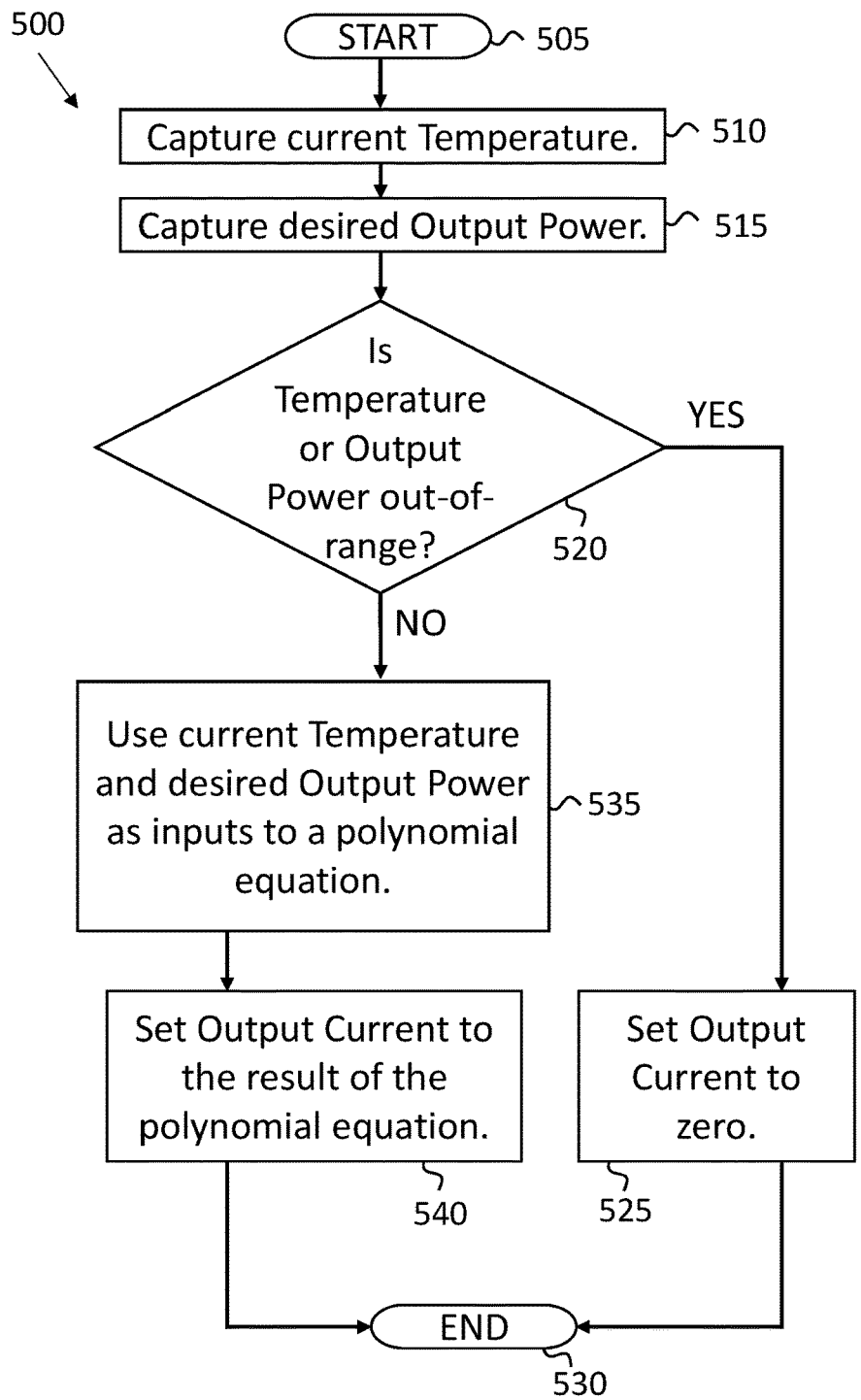
FIGS. 5 and 6 depict software flowcharts of an exemplary OLCC.

FIG. 5 depicts a software flowchart of an exemplary OLCC. An OLCC equational flowchart 500 begins at a START 505. The process begins by capturing the current temperature 510. In some embodiments, the temperature is read from a thermistor co-located with a lasing element. The process then captures the desired output power 515. In some embodiments, the desired optical output power level is an input to the OLCC from a higher-level control circuit, or microcontroller.

If the temperature or the desired output power is out of range capability of the OLCC or the lasing element 520, then the process sets the output current to zero 525, then the process is exited 530.

If the temperature or the desired output power is not out of range capability of the OLCC or the lasing element 520, then the process uses the current temperature and desired output power as inputs to one or more polynomial equations 535. The process then sets the output current to the result of one or more polynomial equations 540. The process is then exited 530.

Figure 6:
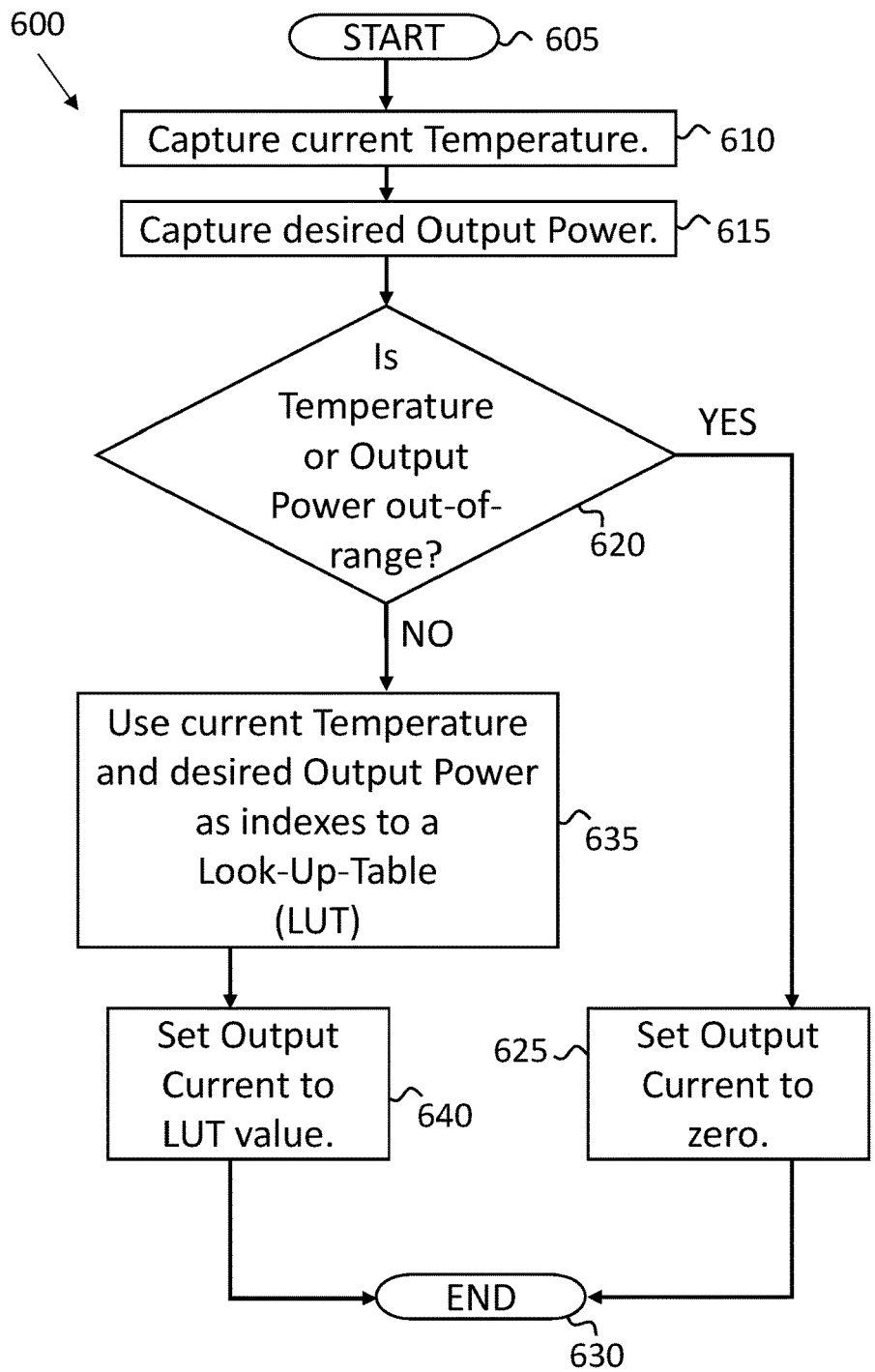

FIG. 6 depicts a software flowchart of an exemplary OLCC. An OLCC look-up-table (LUT) flowchart 600 begins at a START 605. The process begins by capturing the current temperature 610. In some embodiments, the temperature is read from a thermistor co-located with a lasing element. The process then captures the desired output power

615. In some embodiments, the desired output is an input to the OLCC from a higher-level control circuit, or microcontroller.

If the temperature or the desired output power is out of range capability of the OLCC or the lasing element 620, then the process sets the output current to zero 625, then the process is exited 630.

If the temperature or the desired output power is not out of range capability of the OLCC or the lasing element 620, then the process uses the current temperature and desired output power as indexes to one or more LUTs 635 to locate a corresponding output current value. The process then sets the output current to the value described by one or more LUTs 640. The process is then exited 630.

Although various embodiments have been described with reference to the figures, other embodiments are possible. For example, the OLCC may adjust the laser efficiency curve over temperature, including both linear and non-linear portions of the output power vs input current, laser efficiency curve.

In an illustrative example, a 3-dimensional surface may be generated during manufacturing and programmed into the OLCC to compensate each OLCC over temperature. The 3-dimensional surface may enable the generation of a peak optical power at any temperature.

In various examples, the OLCC may employ a family-based temperature compensation method. Further, in this method, a sample of lasers may be characterized during OLCC development. The characterization may generate one or more efficiency curves, which may extend from near the lasing threshold to near the optical power limit, profiled over multiple temperatures. The curves of multiple lasers, at a multitude of target output optical power levels, may be combined to create a family compensation. In this manner, the family combined temperature and optical power profile surface is adjusted in each OLCC unit to line up with an individual laser power calibration at one reference temperature which may be standard operating conditions at room temperature.

In some embodiments, the temperature of a laser may be measured by various temperature sensors (e.g., thermistors, thermocouples, resistive temperature devices (RTDs)). The temperature compensation may be calibrated to the input temperature measurement, which may be measured in degrees Celsius, or may be an analog current or voltage, or ADC conversion.

In an illustrative example, for a given laser input current, the resulting laser output optical power changes non-linearly over temperature. Therefore, for a given laser output optical power, the corresponding input current changes non-linearly over temperature. Further, in some embodiments, the OLCC may compensate the input current to maintain a desired laser output optical power for the given temperature.

In some embodiments, the ambient temperature may be measured directly on the casing of the lasing element. Further, temperature measurements may be taken in more than one location, and the measurements may be combined in a function or used to extrapolate a resulting temperature to be used in the OLCC as described.

In some examples, characterization of the lasing element may be based on multiple components in a random lot or batch. Further, the characterization may be computed on an individual component basis. In some examples, the characterization may be a family of compensation curves, and may be based on one or more representative laser samples.

In some embodiments, the OLCC output current (laser input current) may be based on power look-up-tables, and the temperature compensation may employ an equation. In some embodiments, the temperature compensation may also employ a look-up-table. In some examples, both the desired output optical power and the ambient temperature may be inputs or look-up values to a multidimensional look-up-table, the result or retrieved value may be the current to drive the lasing element. Further, in some examples, both the desired output optical power and the ambient temperature may be inputs to a mathematical function, the result of which may be the OLCC output current to drive the lasing element.

The OLCC may be advantageously employed in applications such as, for example, distance measurements, which may include detecting targets over a wide dynamic range (e.g., both dark and highly reflective targets). The OLCC may also be advantageously employed in ambient environments that experience wide temperature variations.

The OLCC may be advantageously employed in applications that operate over a wide dynamic range. Such applications may utilize a wider range of an operation curve of a laser. Accordingly, these applications may be operable in both the employment of highly reflective targets as well as dark targets. These applications may also be operable in both close-range and long-range measurements.

In various embodiments, the OLCC laser power control may involve a method of first determining a laser efficiency curve at a reference temperature, storing the curve in the OLCC memory, determining a laser efficiency curve at one or more additional temperatures, determining from more than one laser efficiency curve, each at a different temperature, a compensation on the laser current that maintains an arbitrary laser peak power level at an arbitrary temperature, and storing this compensation in the OLCC memory.

In various embodiments, the OLCC laser power control may involve a method of first determining a laser efficiency curve at a reference temperature, storing the curve in the OLCC memory, determining a laser efficiency curve from a subset of lasers at one or more additional temperatures, determining, by combining from a subset of lasers, more than one laser efficiency curve, each at a different temperature, a compensation on the laser current that maintains an arbitrary laser peak power level at an arbitrary temperature, and storing this compensation in the OLCC memory.

In various embodiments, the OLCC laser power control for a laser displacement or distance measurements sensor may first involve setting a desired laser peak optical power level, which may be one or more optical power levels, storing the calibration and compensation into a memory unit, which may be used to determine a laser input current level that results in the desired laser peak optical power level given an estimation of the laser temperature.

In some examples, the OLCC laser power control may employ the calibrated efficiency and compensation to set a laser input current level in order to output a desired laser output optical power level given the estimated laser temperature.

The input current level may be set via a DAC output from a processor. The laser efficiency curve may not be limited to a linear efficiency region of a laser. The temperature compensation curve may not be limited to a linear compensation curve. The estimated laser temperature may be determined from a thermistor or temperature sensor. In various examples, the estimated laser temperature may be determined from a measured forward voltage across the lasing element.

In various examples, the invention may be applied to commercial and industrial settings, for example, laser photoelectric sensors, laser measurement sensors (including triangulation and time-of-flight), optical media, camera position and focus systems.

In some examples, the LUT and calibration may be optimized to have fewer calibration points in the linear region than in the non-linear regions. In some embodiments, the OLCC may employ input current as the compensation variable instead of output power. In some embodiments, the OLCC may provide a straight-forward circuit which may meet various FDA laser class requirements.

In an illustrative example, system performance may be directly related to laser output optical power. In some examples, the OLCC may facilitate laser output optical power consistent over temperature. Further, such consistency may allow operation at the FDA Class limit over a wide temperature range.

In some embodiments, the open-loop nature of the OLCC may minimize loop delay. Further, such minimized delays may make the OLCC applicable to certain usages of lasers, such as time-of-flight measurements, using either pulsed or modulation methods, where the precision of the laser turn-on and turn-off times to tens of picoseconds may be directly related to performance.

Apparatus and associated methods may, in some implementations, relate to an open-loop control circuit (OLCC) which drives a lasing element, the control circuit being configured to receive a measured temperature and to receive a commanded optical power, the control circuit also being configured to determine the lasing element drive current as a function of the commanded optical power and the measured temperature, according to predetermined characteristics of the lasing element, where the absolute value of the second derivative of the optical output power with respect to laser drive current exceeds a predetermined threshold. The OLCC may include a per-laser calibration containing both the linear and non-linear portions of the laser efficiency curve. The calibration may be pre-programmed as a look-up-table. In some examples, calibration may be pre-programmed as equation coefficients. The OLCC may provide laser peak power control for arbitrary peak power, within linear and non-linear regions of laser efficiency, increasing usable dynamic range.

In some embodiments, the apparatus and associated methods may be operable to output a desired "average" output optical power. In some examples, the apparatus and associated methods may be operable to output a desired "peak" output optical power. It will be understood that average optical power may be calculated from and peak power (and vice versa) when factoring in system timing (e.g., peak power pulse widths, periods, duty cycles). Further, peak power may not be affected by changes in system timing.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from the source to the first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using Omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Fire wire, ATA/IDE, RS-232, RS-422, RS-485, 802.11 a/b/g, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A method to generate signals to control output power of a laser element, the method comprising:
    measuring, with a sensor, temperature information indicative of a temperature of a laser source;
    receiving, at a controller, the measured temperature information;
    receiving, at the controller, a commanded optical output power signal representing a desired optical output power to be output by the laser source in response to a drive current supplied to an input of the laser source;
    providing a data store operably coupled to the controller, wherein the data store contains information about a predetermined efficiency characteristic that relates the commanded optical output power by the laser source to a drive current supplied to the laser source, the efficiency characteristic information including adjustments responsive to the measured temperature of the laser source for a plurality of temperatures;
    retrieving, with the controller, at least a portion of the predetermined efficiency characteristic information sufficient to determine the drive current that, when supplied to the laser source while operating at the temperature of the laser source indicated by the measured temperature information, is operable to cause the laser source to generate substantially the desired optical output power;
    when the retrieved predetermined efficiency characteristic information indicates that the desired optical output power at the measured temperature of the laser corresponds to a substantially non-linear portion of the predetermined efficiency characteristic, determining the drive current signal based upon the retrieved predetermined efficiency characteristic as a function of the commanded optical output power signal and the measured temperature information; and,
    supplying, to the input of the laser source, the determined drive current signal operative to generate an optical output from the laser source substantially at the desired optical output power.

2. The method of claim 1, wherein the non-linear portion of the predetermined efficiency characteristic is characterized by the fact that an absolute value of the second derivative of the optical output power with respect to the drive current exceeds a predetermined threshold.

3. The method of claim 1, wherein the non-linear portion of the predetermined efficiency characteristic is characterized by the fact that a variance from a linear extrapolation of the slope at a predetermined nominal operating point exceeds a predetermined threshold.

4. The method of claim 1, further comprising converting, at an analog-to-digital converter, an analog signal received from the sensor and indicative of the measured temperature to a digital signal representing the measured temperature information.

5. The method of claim 1, wherein the determined drive current comprises an amplitude of the gate drive signal to supply to the input of the laser source to cause the laser source to output substantially the desired optical output power.

6. The method of claim 1, wherein the step of supplying the determined drive current signal further comprises converting, with a digital-to-analog converter, the determined drive current signal from a digital representation in the controller to an analog signal.

7. The method of claim 1, further comprising providing a driver circuit operatively coupled to the controller and to the input of the laser source, the driver circuit being configured to supply the determined drive current signal to the input of the laser source.

8. The method of claim 1, further comprising retrieving, with the controller, the commanded optical output power signal from a non-volatile memory location.

9. The method of claim 1, wherein the plurality of temperatures comprises a predetermined range of temperatures.

10. The method of claim 9, wherein the predetermined range of temperatures extends from negative 40 to positive 85 degrees Celsius.

11. The method of claim 1, wherein the predetermined efficiency characteristic comprises information stored in the data store in the form of a look up table.

12. The method of claim 1, wherein the predetermined efficiency characteristic comprises information stored in the data store in the form of a plurality of coefficients of a non-linear function for at least one predetermined efficiency characteristic of the laser source.

13. The method of claim 1, wherein the predetermined efficiency characteristic comprises information stored in the data store in the form of temperature adjustment information to compensate a determined drive current signal at a nominal temperature to a determined drive current signal according to the received measured temperature information.

14. The method of claim 1, wherein the predetermined efficiency characteristic information represents a normative efficiency characteristic statistically determined from one or more laser sources in the same lot as said laser source.

15. A laser power control apparatus adapted to generate signals to control output power of a laser element, the apparatus comprising:
    a sensor configured to measure temperature information indicative of a temperature of a laser source;
    a controller operably coupled to the sensor and configured to:
        (a) receive the measured temperature information; and,
        (b) receive a commanded optical output power signal representing a desired optical output power to be output by the laser source in response to a drive current supplied to an input of the laser source;

a data store operably coupled to the controller, wherein the data store contains information about a predetermined efficiency characteristic that relates the commanded optical output power by the laser source to a drive current supplied to the laser source, the efficiency characteristic information including adjustments responsive to the measured temperature of the laser source for a plurality of temperatures, wherein the controller is further configured to retrieve at least a portion of the predetermined efficiency characteristic information sufficient to determine the drive current that, when supplied to the laser source while operating at the temperature of the laser source indicated by the measured temperature information, is operable to cause the laser source to generate substantially the desired optical output power, wherein when the retrieved predetermined efficiency characteristic information indicates that the desired optical output power at the measured temperature of the laser corresponds to a substantially non-linear portion of the predetermined efficiency characteristic, the controller is further configured to determine the drive current signal based upon the retrieved predetermined efficiency characteristic as a function of the commanded optical output power signal and the measured temperature information; and, a driver circuit operatively coupled to the controller and to the input of the laser source, the driver circuit being configured to supply the determined drive current signal to the input of the laser source, wherein the determined drive current signal is operative to generate an optical output from the laser source substantially at the desired optical output power.

16. The laser power control apparatus of claim 15, wherein the non-linear portion of the predetermined efficiency characteristic is characterized by the fact that an absolute value of the second derivative of the optical output power with respect to the drive current exceeds a predetermined threshold.

17. The laser power control apparatus of claim 15, wherein the non-linear portion of the predetermined efficiency characteristic is characterized by the fact that a variance from a linear extrapolation of the slope at a predetermined nominal operating point exceeds a predetermined threshold.

18. The laser power control apparatus of claim 15, wherein the predetermined efficiency characteristic comprises information stored in the data store in the form of a look up table.

19. The laser power control apparatus of claim 15, wherein the predetermined efficiency characteristic comprises information stored in the data store in the form of a plurality of coefficients of a non-linear function for at least one predetermined efficiency characteristic of the laser source.

20. The laser power control apparatus of claim 15, wherein the predetermined efficiency characteristic comprises information stored in the data store in the form of temperature adjustment information to compensate a determined drive current signal at a nominal temperature to a determined drive current signal according to the received measured temperature information.

* * * * *